United States Patent [19]
Murray et al.

[11] Patent Number: 5,169,796
[45] Date of Patent: Dec. 8, 1992

[54] PROCESS FOR FABRICATING SELF-ALIGNED METAL GATE FIELD EFFECT TRANSISTORS

[75] Inventors: Roger Murray, Palo Alto; Nevand Godhwani, Sunnyvale, both of Calif.

[73] Assignee: Teledyne Industries, Inc., Mountain View, Calif.

[21] Appl. No.: 762,612

[22] Filed: Sep. 19, 1991

[51] Int. Cl.⁵ .............................................. H01L 21/70
[52] U.S. Cl. .......................................... 437/41; 437/29; 437/34; 437/40; 437/44; 437/56; 437/247; 437/950; 437/986; 148/DIG. 3; 148/DIG. 4
[58] Field of Search ................. 437/29, 34, 40, 41, 437/44, 56, 247, 934, 950, 986; 148/DIG. 3, DIG. 4

[56] References Cited

U.S. PATENT DOCUMENTS

| | | | |
|---|---|---|---|
| 3,596,347 | 8/1971 | Beale et al. | 437/44 |
| 3,679,492 | 7/1972 | Fang et al. | 437/41 |
| 3,739,237 | 6/1973 | Shannon | 437/41 |
| 3,936,857 | 2/1976 | Ota | 437/44 |
| 3,959,025 | 5/1976 | Pohnsky | 437/41 |
| 4,023,195 | 5/1977 | Richman | 437/41 |
| 4,043,025 | 8/1977 | Spadea | 437/41 |
| 4,084,311 | 4/1978 | Yasuoka et al. | 437/41 |
| 4,109,371 | 8/1978 | Shubata et al. | 437/41 |
| 4,210,465 | 7/1986 | Brower | 437/41 |
| 4,235,011 | 11/1980 | Butler et al. | 437/40 |
| 4,265,934 | 5/1981 | Ladd, Jr. | 156/649 |
| 5,017,508 | 5/1991 | Dodt et al. | 437/174 |

OTHER PUBLICATIONS

Wolf "Silicon Processing for the ULSI Era" pp. 57–58, 307–308, 325–326, 1986.

*Primary Examiner*—Tom Thomas
*Attorney, Agent, or Firm*—Fliesler, Dubb, Meyer & Lovejoy

[57] ABSTRACT

A method of fabricating a metal-gate field effect transistor having source and drain regions which are self-aligned with the gate. The source and drain dopants are introduced into the substrate and driven. Then, a metal gate is formed, the metal gate having a length which is approximately the same as the length of the channel. After the gate is fabricated, dopant ions are implanted into any portions of the channel not covered by the gate. These dopant ions are activated by rapid thermal annealing at a temperature selected to avoid damage to the metal gate, to form bridge regions which extend one or both of the source/drain regions into the channel and which are self-aligned with the gate.

23 Claims, 3 Drawing Sheets

PROCESS FOR FABRICATING SELF-ALIGNED METAL GATE FIELD EFFECT TRANSISTORS

CROSS-REFERENCE TO RELATED PATENT

This application is related to U.S. Pat. No. 5,024,962.

BACKGROUND OF THE INVENTION

1. Field of the Invention

The present invention relates to the manufacture of metal gate field effect transistors, and more particularly, to metal gate CMOS processing techniques.

2. Description of the Related Art

Conventional processes for fabricating metal gate field effect transistors include the following sequential steps: forming source and drain ("S/D") regions by implanting and/or diffusing dopant ions having the appropriate conductivity type; growing a gate oxide; and forming a metal conductor over the gate oxide. The source and drain regions are spaced apart to define a channel therebetween, and the portion of the gate oxide and the metal conductor overlying the channel are referred as the "gate". The metal portion of the gate must be deposited after the S/D regions have been diffused because the metal (usually aluminum) would not survive the high temperature processing necessary to diffuse the S/D regions. On the other hand, silicon gate FETs can be readily fabricated with self-aligned S/D regions. This is possible because the silicon gate, which unlike aluminum can withstand the high temperature of a diffusion cycle, may be formed before the S/D regions are implanted and diffused.

The acronym "MOS", which stands for metal-oxide-silicon, generally refers to all field effect transistor structures ("FETs"), including those fabricated with metal or polysilicon gates. However, as used herein, "MOS", "metal gate field effect transistor", "metal gate CMOS FET", and similar terms refer only to FETs in which the gates include a metal (aluminum) conductive layer, as opposed to gates which include a polysilicon or a refractory metal (e.g., molydenum or tungsten) conductive layer.

Ideally, a gate (whether metal or polysilicon gate) should overlie the entire channel length with minimal, if any, overlap of the S/D regions. This orientation reduces capacitances associated with the overlap region(s). Such capacitances are known as "parasitic" capacitances. However, in conventional metal gate processes a substantial overlap of the metal gate and both S/D regions is necessary to insure that the metal gate overlies the entire channel. This overlap magnifies the parasitic capacitance of the FET, reducing the switching speed of the FET; ultimately the frequency response of the FET and any circuit including the FET is reduced by the parasitic capacitances.

Optimal gate alignment depends in large part on the nature of the gate material and fabrication process of the gate. For example, in silicon gate technology, a polysilicon gate is deposited on a thin gate oxide layer before the S/D regions are formed. The gate then serves as a mask during the formation of the S/D regions and defines the channel length. As a direct result of this technique, alignment of the gate with the S/D regions is achieved without problems of the mask alignment during processing. The self-alignment technique would be beneficial when fabricating metal gate FETS.

If a conventional self-alignment technique is used to fabricate a metal gate FET, the metal gate would be in place before the regions to be self-aligned with the gate (the S/D regions) are implanted. To fabricate an operational device, the gate material must maintain its integrity throughout subsequent processing steps in the fabrication of the transistor. Aluminum will not tolerate process temperatures associated with the diffusion of the S/D regions and the growth of the gate oxide.

The dopant ions implanted using the gate as a mask must subsequently be activated (or diffused) at an elevated temperature to form S/D regions. The annealing process utilized for this purpose is typically performed at temperatures of 900° C. or greater. Metal gate materials, such as aluminum, will melt and/or evaporate when exposed to these temperatures. For example, an aluminum/silicon eutectic is 577° C., and therefore an aluminum gate will disintegrate at typical annealing and diffusion/drive-in temperatures.

SUMMARY OF THE INVENTION

It is, therefore, an object of the present invention to provide a self-aligned metal gate field effect transistor and a method of fabricating same.

Another object of the present invention is to provide a metal gate FET having reduced distributed capacitances and a method of fabricating same.

Another object of the present invention is to provide a metal gate FET having an increased frequency response with respect to conventional metal gate FETs and a method of fabricating same.

These and other objects of the present invention are provided by a method in which source/drain regions are formed in a substrate, the source and drain regions being spaced apart to define a channel therebetween, and a metal gate is provided to overlie the channel. The channel has a nominal length L and the gate may have a length which is less than, equal to, or greater than L. Ideally, the gate length will be approximately equal to L. In order to assure that the gate overlies the entire channel and to provide source/drain regions which are self-aligned with the gate, an implant of dopant ions having the appropriate polarity is performed after the gate metal is defined. This implant may have a lower dosage and may use a lower energy than the implant which forms the primary source/drain regions. The dopant ions implanted after the gate is fabricated are activated by rapid thermal annealing for a time and at a temperature which is too short to cause damage to the metal gate, but which is sufficient to activate the dopant ions so that bridge regions are formed. The bridge regions extend one or both of the source/drain regions into the channel and are thus "self-aligned" with the metal gate.

Rapid thermal annealing ("RTA") is a method of heating the device to a temperature sufficient to cause activation of the implanted dopant ions, but for so short a time as not to permit diffusion of junctions or excessive alloying of the aluminum to occur. The useful range of temperatures for RTA ranges from about 400° C. to 650° C., just below the melting point of aluminum.

A method in accordance with the present invention for fabricating a metal gate field effect transistor in a substrate, comprises the steps of: (a) providing two source/drain regions, the source/drain regions being spaced apart to define a channel therebetween; (b) providing a gate oxide overlying the source/drain regions and the channel; (c) providing a metal gate overlying a first portion of the channel; (d) providing dopant ions in a second portion of the channel using the metal gate provided in said step (c) as a mask; and (e) activating the dopant ions provided in said step (d) by rapid thermal annealing to form a bridge region which is self-aligned with the metal gate and which extends one of the source/drain regions laterally into the channel.

A metal gate field effect transistor in accordance with the present invention comprises: a substrate; a source region and a drain region provided in said substrate, said source and said drain regions being spaced apart to define a channel therebetween, said channel; a gate oxide layer overlying said source region, said drain region, and said channel; a metal gate overlying a first portion of said channel; first and second bridge regions provided in a second portion of said channel, said first and second bridge regions being self-aligned with opposite ends of said metal gate and extending respective ones of said source and drain regions laterally into the channel.

DESCRIPTION OF THE PREFERRED EMBODIMENT

The method of the present invention will be described with reference to FIGS. 1-7. As described herein, the structure illustrated and the method described relate to metal gate CMOS FETs. It is to be understood, however, the present invention is useful for fabricating other devices, including individual N-channel and P-channel metal gate FETs. Further, although the substrate described herein is an N-type substrate having P-wells formed therein, the present invention is equally applicable to devices formed in a P-type substrate having N-wells. Except as otherwise indicated all implant energies, dosages, times, temperatures, and thickness are approximate, and may be altered in accordance with the knowledge of those having ordinary skill in the art.

Figure 1:
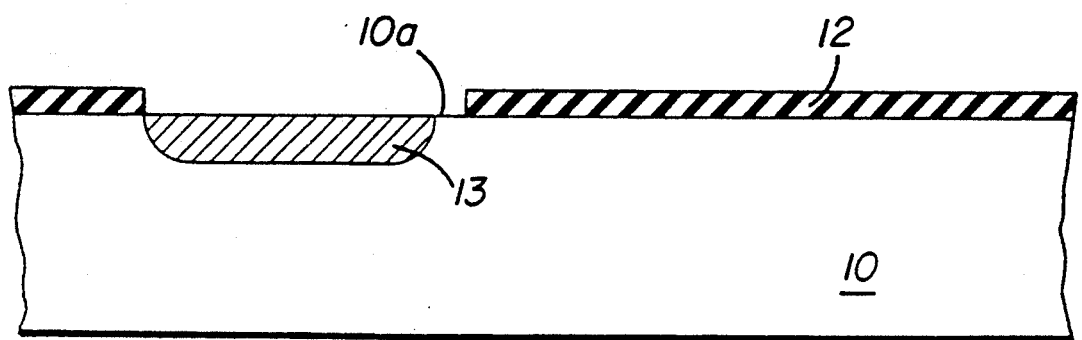
FIGS. 1 through 7 are sectional views useful in describing the structure and various steps of the method of fabricating a metal gate FETs in accordance with the present invention.

As shown in FIG. 1, a substrate 10, having a first surface 10a and a second surface 10b, has an initial oxide 12 formed on the first surface 10a. Substrate 10 has an N-type background doping concentration of approximately $1 \times 10^{15} cm^{-3}$. In the preferred embodiment, initial oxide 12 has a thickness of 8600Å and is grown using a three step dry, wet, dry oxidation process. Initial oxide 12 may have a thickness ranging from 5,000Å to 15,000Å.

Initial oxide 12 is masked and etched to expose the first surface 10a of substrate 10 in regions where P-wells are to be formed. The coating, exposing and developing of the photo-resist layer (not shown) are performed using standard techniques. After the initial oxide 12 is removed, boron P-type dopant ions are implanted at an energy of approximately 80 KeV with an implant dose of approximately $1 \times 10^{13} cm^{-2}$. The boron implant 13 is driven at 1000°-1250° C. for 9 to 11 hours in an atmosphere comprising nitrogen ($N_2$) and 1-10% oxygen ($O_2$), followed by a wet oxidation at 900°-1100° C. for 30 to 90 minutes. The time and temperature of these drive and oxidation processes may be varied to achieve the desired P-well surface concentration and junction depth.

Figure 2:
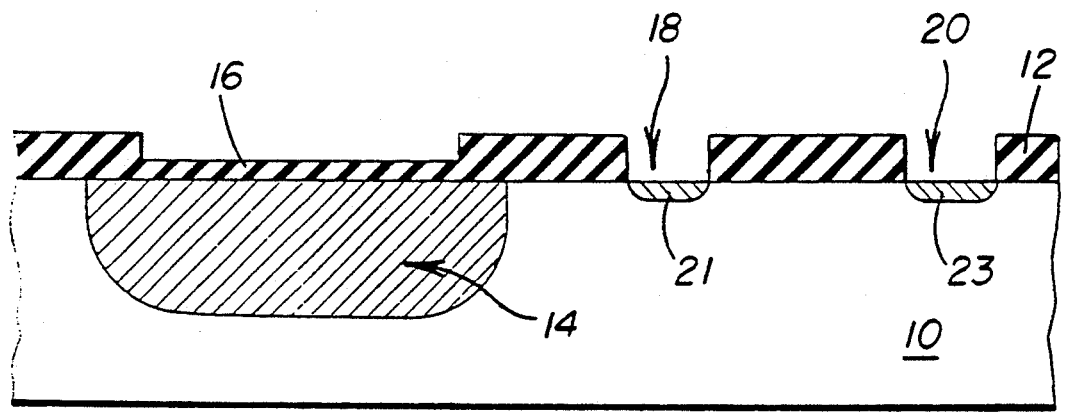

With reference to FIG. 2, driving the P-well implant 13 diffuses the dopant ions, forming P-well 14. In addition, a second oxide layer 16 is grown on the surface 10a of substrate 10 where initial oxide 12 was previously removed. The second oxide layer 16 has thickness of approximately 5,000Å, and the thickness of initial oxide 12 is increased to approximately 10,000Å.

After P-well 14 has been formed, oxides 12 and 16 are masked and etched to form openings 18 and 20 corresponding to positions where source and drain regions of a P-channel transistor are to be formed. The substrate 10 is placed in an atmosphere comprising diborane gas ($B_2H_6$) to introduce P-type dopant ions (i.e., boron ions 21, 23) into the substrate through openings 18 and 20. Another source of Boron is $BBr_3$. The boron ions 21, 23 are driven at a temperature of approximately 900°-1100° C. for approximately one to two hours to diffuse the boron ions, thereby forming P+-type source and drain regions 22, 24 having a surface concentration of approximately $10^{19} cm^{-3}$.

Figure 3:
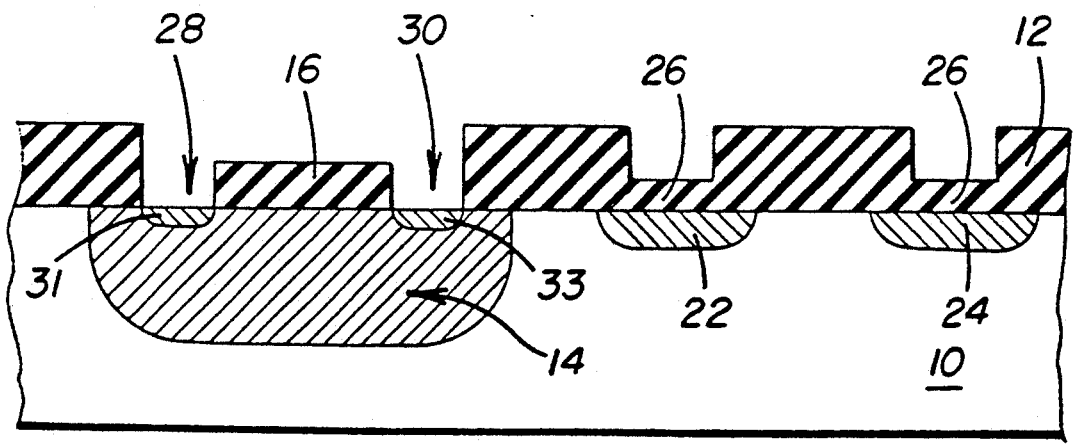
Figure 4:
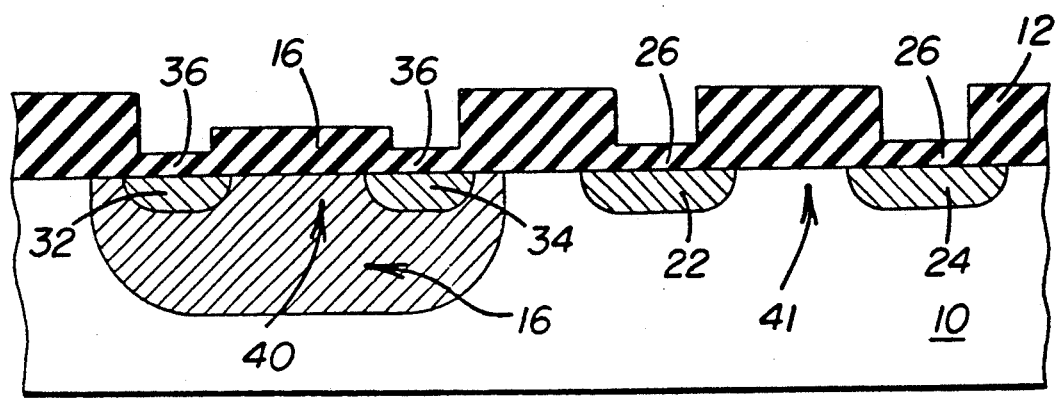

With reference to FIG. 3, third oxide layers 26 having a thickness of 4000Å are formed during the drive-in process which forms source and drain regions 22, 24. Additionally, initial oxide 12 is increased in thickness to approximately 1.1 μm. The thickness of second oxide layer 16 is also increased. The time and temperature used to drive the P-type dopant ions may be adjusted to achieve the desired sheet resistance ($\Omega/\square$) and junction depth.

Another masking process provides openings 28 and 30 in second oxide layer 16 where source and drain regions of an N-channel transistor are to be formed. This is followed by the introduction of N-type dopant ions 31, 33, typically phosphorus, in an atmosphere comprising phosphine ($PH_3$) or phosphorus oxychloride ($POCl_3$) at a approximately 850°-950° C. for a time sufficient to achieve an surface concentration of approximately $10^{20} cm^{-3}$ in source and drain regions 31, 33. Next, the N-type dopant ions 31, 33 are driven-in at 900°-1050° C. for one to two hours. The time and temperature used to drive the N-type dopant ions may be adjusted to achieve the desired sheet resistance ($\Omega/\square$) and junction depth.

Fourth oxide layers 36 having a thickness of approximately 5300Å are formed during the drive-in which forms source and drain regions 32, 34. Further, the thickness of initial oxide 12 is increased to approximately 1.2 μm, and the thicknesses of second oxide layer 16 and third oxide layers 26 are also increased. The time and temperature used to drive the N-type dopant ions may be adjusted to achieve the desired sheet resistance ($\Omega/\square$) and junction depth.

At this point in the process, the formation of a sealing oxide 42 is optional. This process is described in U.S. Pat. No. 5,024,962, which is hereby incorporated by reference.

Figure 5:
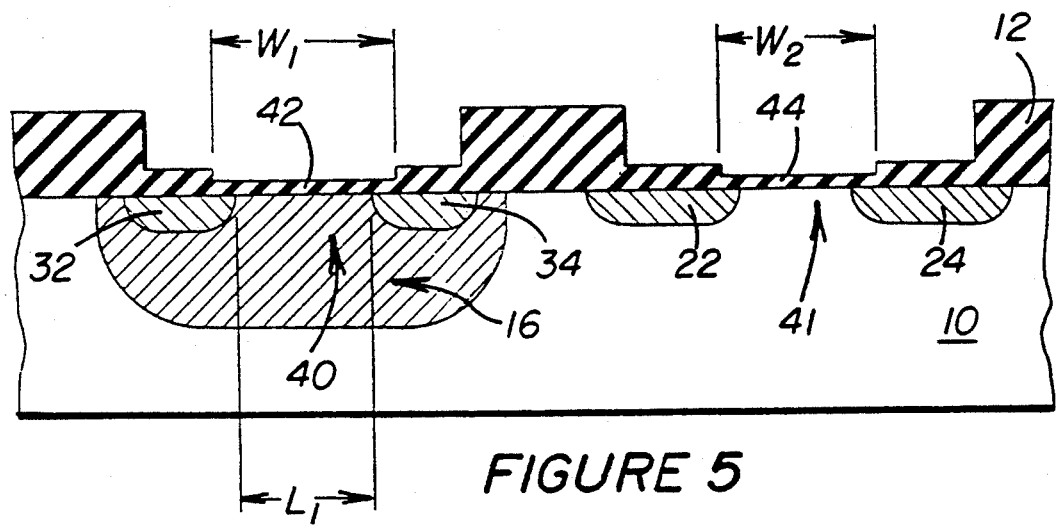
Figure 6:
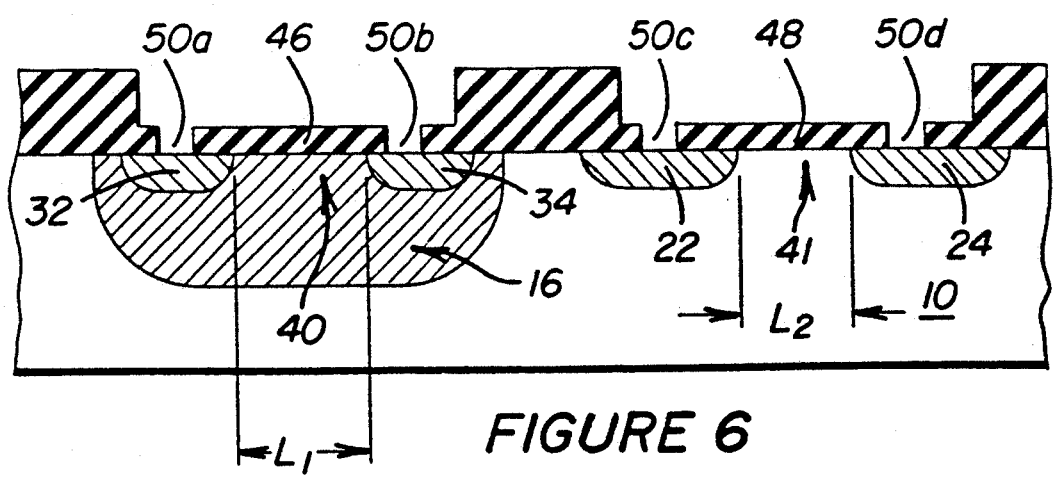
Figure 7:
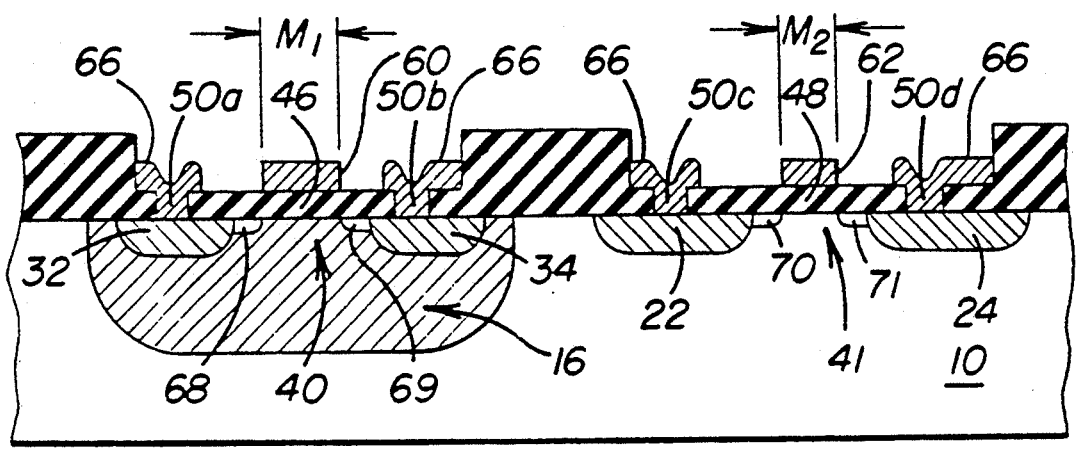

The fabrication of a gate oxide 46 will be described with reference to FIGS. 5 and 6. A masking process removes portions of oxide layers 12, 16, 26, and 36 to expose the surface 10a of substrate 10 in regions where sealing and gate oxide layers 42, 46 are to be formed. The openings overlap source and drain regions 22, 24, 32, and 34, to ensure that the oxide layers to be formed will cover the entirety of channel regions 40, 41. In an exemplary embodiment, the channel lengths $L_1$, $L_2$ are 6 μm and the windows opened for sealing and gate oxide layers 42, 46 have lengths $W_1$, $W_2$ of approximately 8 μm.

Next, the wafers undergo gate oxidation at approximately 1000° C. in an atmosphere comprising oxygen ($O_2$) and trichlorcethane (TCA) to form gate oxide 46.

Contact windows 50a-d are then opened, and a metal layer is deposited over the entire wafer. The metal layer is formed in contact windows 50a-d and makes electrical contact with the source and drain regions 22, 24, 32, 34. Then, the metal layer is masked and etched so that metal gates 60, 62 and metal lines 66 remain. The metal gates 60, 62 have a drawn length which is approximately three-quarters of the lengths $L_1$, $L_2$ of the respective channel regions 40, 41. The actual lengths $M_1$, $M_2$ of metal gates 60, 62 is approximately one-half of the corresponding channel length $L_1$, $L_2$. The actual gate length is the length of the metal gates 60, 62 after etching; the actual length is less than the drawn length because of the lateral etching which occurs during the etching process utilized to form the metal gates 60, 62. Using the exemplary lengths discussed above ($L_1$, $L_2$ approximately 6 $\mu$m), the drawn gate lengths are approximately 4.5 $\mu$m and the actual gate lengths $M_1$, $M_2$ are approximately 3 $\mu$m.

After the metal gates 60, 62 are formed, bridge regions (bridges) 68-71 are implanted and activated by rapid thermal annealing. Bridges 68-71 are self-aligned with corresponding gates 60, 62 and extend corresponding ones of source and drain regions 22, 24, 32, 34 laterally into corresponding channels 40, 41.

If the bridges are to have N-type conductivity, phosphorus dopant ions are implanted at an energy between approximately 80 keV and approximately 250 keV and to a dopant density between approximately $1 \times 10^{12} cm^{-2}$ and approximately $1 \times 10^{16} cm^{-2}$, in the preferred embodiment, the phosphorus dopant density is approximately $1 \times 10^{15} cm^2$. If the bridges are to have P-type conductivity, boron ions are implanted at an energy between approximately 50 keV and 150 keV and to a dopant density between approximately $1 \times 10^{12} cm^{-2}$ and approximately $1 \times 10^{16} cm^{-2}$. In the preferred embodiment, the boron dopant density is approximately $1 \times 10^{15} cm^{-2}$. For both phosphorus and boron using a higher implant energy provides a lower resistance when the FET is conducting.

During the ion implant used to introduce the bridge dopant ions, the metal gates 60, 62 act as masks, resulting in the self-alignment of bridges 68 and 69 with opposite ends of metal gate 60 and of bridges 70 and 71 with opposite ends of metal gate 62;

The bridge dopants must be activated in order to obtain the desired electrical properties of the bridge regions 68-71. However, g process used to activate the bridge dopants must be performed in a manner which does not damage the metal gates 60, 62. In the preferred embodiment, the bridge dopants are activated by a combination of rapid thermal annealing (at temperatures between approximately 500° C. and approximately 650° C. for a time between approximately 45 seconds and approximately 5 seconds) and furnace annealing (at a temperature of less than 500° C. for a time between 10 and 30 minutes). This range of temperatures is below the melting point of aluminum, and thus aluminum gates would not be damaged. In addition, aluminum will reflect some infra-red radiation which aids in allowing sufficient activation without damage to the aluminum. If other metals are selected for the metal gates 60, 62, the annealing temperature and times may be adjusted for the alternate metals. The combination of RTA and furnace annealing provides an acceptable value of series resistance for the shallow bridge regions (or S/D extensions) and the primary S/D regions. For N-type transistors, acceptable series resistance values are in the range of 50-100 $\Omega/\square$, and for P-type transistors, acceptable series resistance values are in the range of 1-1.5 K$\Omega/\square$.

Testing has shown that metal gate FETs having the structure described and fabricated with the method described have an effective frequency response which is twice as fast as conventional metal gate FETs.

We claim:

1. A method for fabricating a metal gate field effect transistor in a substrate, comprising the steps of:
    (a) providing two source/drain regions in the substrate, the source/drain regions being spaced apart to define a channel therebetween;
    (b) providing a gate oxide overlaying the source/drain regions and the channel;
    (c) providing a metal gate overlying a first portion of the channel;
    (d) providing dopant ions in a second portion of the channel using he metal gate provided in said step (c) as a mask; and
    (e) activating the dopant ions provided in said step (d) by rapid thermal annealing at temperatures between approximately 400° C. and 650° C. for a time between approximately 5 seconds and approximately 45 seconds and (ii) furnace annealing at a temperature less than or equal to 500° C. or a time between approximately 10 minutes and 30 minutes to form a bridge region which is self-aligned with the metal gate and which extends one of the source/drain regions laterally into the channel.

2. A method according to claim 1, wherein the channel has an N-type conductivity and said step (d) comprises implanting boron ions at an energy between approximately 50 keV and 150 keV and to a dopant density between approximately $1 \times 10^{12} cm^{-2}$ and approximately $1 \times 10^{16} cm^{-2}$.

3. A method according to claim 2, wherein said step (d) comprises implanting boron ions to a dopant density of approximately $1 \times 10^{15} cm^{-2}$.

4. A method according to claim 1, wherein step (e) comprises activating the dopant ions provided in said step (d) by rapid thermal annealing to form two bridge regions which are self-aligned with the metal gate nd which extend corresponding ones of the source/drain regions laterally into the channel.

5. A method according to claim 1, wherein said step (e) comprises rapid thermal annealing at temperatures between approximately 500° C. and approximately 550° C.

6. A method according to claim 1, wherein the channel has an P-type conductivity and said step (d) comprises implanting phosphorus dopant ions at an energy between approximately 80 keV and approximately 250 keV and to a dopant density between approximately $1 \times 10^{12} cm^{-2}$ and approximately $1 \times 10^{16} cm^{-2}$.

. 7. A method according to claim 4, wherein the channel has an P-type conductivity and said step (d) comprises implanting phosphorus dopant ions at an energy between approximately 80 keV and approximately 250 keV and to a dopant density between approximately $1 \times 10^{12} cm^{-2}$ and approximately $1 \times 10^{16} cm^{-2}$.

8. A method according to claim 7, wherein said step (d) comprises implanting phosphorus ions to a dopant density of approximately $1 \times 10^{13} cm^{-2}$.

9. A method according to claim 6, wherein said step (d) comprises implanting phosphorus ions to a dopant density of approximately $1 \times 10^{13} \text{cm}^{-2}$.

10. A method according to claim 4, wherein the channel has an N-type conductivity and said step (d) comprises implanting boron ions at an energy between approximately 50 keV and 150 keV and to a dopant density between approximately $1 \times 10^{12} \text{cm}^{-2}$ and approximately $1 \times 10^{16} \text{cm}^{-2}$.

11. A method according to claim 10, wherein said step Z(d) comprises implanting boron ions to a dopant density of approximately $1 \times 10^{15} \text{cm}^{-2}$.

12. A method of fabricating a metal gate field effect transistor in a substrate, comprising the step of:
   (a) providing two source/drain regions in the substrate, the source/drain regions being spaced apart to define a channel therebetween, the channel having a length L;
   (b) providing a gate oxide overlying the source/drain regions and the channel;
   (c) provide in a metal gate overlying at least a first portion of the channel, the first portion of the channel having a length M, where M is approximately equal to or less than L;
   (d) implanting dopant ions in a second portion of the channel after said step (c); and
   (e) activating the dopant ions provided in said step (d) (i) by rapid thermal annealing at temperatures between approximately 500°0 C. and 550° C. for a time between approximately 5 seconds and approximately 45 seconds, and (ii) furnace annealing at a temperature less than or equal to 500° C. for a time between approximately 10 minutes and 30 minutes to form a bridge which extends a source/drain region laterally into the second portion of the channel and which is elf-aligned with the metal gate.

13. A method according to claim 12, wherein step (e) comprises activating the dopant ions provided in said step (d) by rapid thermal annealing to form two bridge regions which are self-aligned with the aluminum gate and which extend corresponding ones of the source/drain regions laterally into the channel.

14. A method of fabricating a metal gate field effect transistor in a substrate, comprising the steps of:
   (a) providing tow source/drain regions in the substrate, the source/drain regions being spaced apart to define a channel therebetween, the channel having a length L;
   (b) providing a gate oxide overlying the source/drain regions and the channel;
   (c) providing an aluminum gate overlying at least a portion of the channel, the aluminum gate having a length M, where M is approximately equal to or less than L;
   (d) providing dopant ions in a second portion o the channel using the aluminum gate as a mask; and
   (e) actuating the dopant ions provided in said step (d) (i) by rapid thermal annealing at temperatures between approximately 500° C. and 550° c. for a time between approximately 5 seconds and approximately 45 seconds and (ii) furnace annealing at a temperature less than or equal to 500° C. for a time between approximately 10 minutes and 30 minutes to form a bridge which extends a source/drain region laterally into the second portion of the channel and which is self-aligned with the aluminum gate.

15. A method according to claim 14, wherein step (e) comprises activating the dopant ions provided in said step (d) by rapid thermal annealing to form two bridge regions which are self-aligned with the aluminum gate and which extend corresponding ones of the source/drain regions laterally into the channel.

16. A method of fabricating a metal gate field effect transistor in a substrate, comprising the steps of:
   (a) providing a source and a drain region in the substrate, the source and rain regions being spaced apart to define a channel therebetween, the channel having a length L;
   (b) providing a gate oxide overlying the source/drain regions and he channel;
   (c) providing a metal gate overlying a first portion of the channel, the metal gate having a length M, where M is approximately L/2;
   (d) providing dopant ions in a second portion and a third portion of the channel using the metal gate as a mask; and
   (e) activating the dopant ions provided in said step (d) (i) by rapid thermal annealing at temperatures between approximately 500° C. and 550° c. or a time between approximately 5 seconds and approximately 45 seconds and (ii) furnace annealing at a temperature less than or equal to 500° C. for a time between approximately 10 minutes and 30 minutes to form a first bridge in the second portion of the channel and to form a second bridge in the third portion of the channel, the first and second bridges being self-aligned with the metal gate.

17. A method according to claim 16, wherein step (e) comprises activating the dopant ions provided in said step (d) by rapid thermal annealing.

18. A method of fabricating CMOS field effect transistor in a substrate having N-type conductivity and a surface, comprising the steps of:
   (a) growing a first oxide layer on the surface of the substrate;
   (b) removing a first selected portion of he first oxide layer corresponding to a region where a P-well is to be formed;
   (c) forming a P-well by implanting P-type dopant ions in the substrate using the portions of the first oxide layer remaining after said step (b) as a mask;
   (d) annealing the structures formed in said steps (a)–(c) to activate the dopant ions implanted in said step (c) and to grow a second oxide labyrinth regions where the first oxide layer was removed in said step (b);
   (e) implanting P-type dopant ions using the portions of the first oxide layer remaining after said step (d) and the second oxide layer as masks;
   (f) implanting N-type dopant using the portions of the first oxide layer remaining after said step (e) an eh second oxide layer as masks;
   (g) annealing the structures formed in said steps (a)–(f) to activate the dopants implanted in steps (e) and (f) to form P-type and N-type source/drain regions, the P-type source/drain regions being spaced apart to define a first channel of length $L_1$ therebetween and the N-type source/drain regions being spaced apart to define a second channel of length $L_2$ therebetween nd to grow a third oxide layer;
   (h) removing selected portions of the third oxide layer to expose portions of the surface of the substrate corresponding to the channel regions;

(i) forming first and second aluminum gates, the aluminum gates overlying at least a portion of each of the respective first and second channel regions;

(j) implanting in the first channel a P-type dopant using the first aluminum gate as a mask;

(i) implanting in the second channel an N-type dopant using the second aluminum gate as a mask; and (l) activating the dopants implanted in steps (j) and (k) by rapid thermal annealing at a temperature between 500° C. and 550° C. for a time less than approximately 45 seconds to form a P-type bridge in the first channel and an N-type bridge in the second channel, each o the bridges extending a corresponding source/drain region laterally into the respective channel and being self-aligned with the respective aluminum gate.

19. A method according to claim 12, wherein said step (i) comprises forming a first aluminum gate having a length $M_1$, where $L_1$ is greater than $M_1$ and forming a second aluminum gate having a length $M_{-2}$, where $L_2$ is greater than $M_2$.

20. A method according to claim 19, whereby said step (l) comprises forming two P-tyep bridges extending corresponding ones of the P-type source/drain regions laterally into the first channel, the P-type bridges being self-aligned with the first aluminum gate, and forming two N-type bridges extending corresponding ones of the N-type source/drain regions laterally into the second channel, the N-type bridges being self-aligned with the second aluminum gate.

21. A method according to claim 19, wherein said step (i) comprising forming a first aluminum gate having a length $M_1$, where $L_1$ is approximately equal to or less than $M_1$ and forming a second aluminum gate having a length $M_2$, where $L_2$ is approximately equal to or less than $M_2$.

22. A method according to claim 21, whereby said step (l) comprises forming one P-type bridge extending one of the P-type source/drain regions laterally into the first channel, the P-tyep bridge being self-aligned with he first aluminum gate, and forming one N-type bridge extending one of the N-type source/drain regions laterally into the second channel, the N-type bridge being self-aligned with the second aluminum gate.

23. A method of fabricating CMOS field effect transistor according to claim 19, wherein said step (l) comprises forming two P-type bridges extending corresponding ones of the P-tyep source/drain regions laterally into he first channel, the P-type bridges being self-aligned with he first aluminum gate, and forming one N-type bridge extending one of the N-type source/drain regions laterally into the second channel, the N-type ridge being self-aligned with the second aluminum gate.

* * * * *

UNITED STATES PATENT AND TRADEMARK OFFICE
CERTIFICATE OF CORRECTION

PATENT NO. : 5,169,796

DATED : December 8, 1992

INVENTOR(S) : Roger Murray and Nevand Godhwani

Page 1 of 2

It is certified that error appears in the above-identified patent and that said Letters Patent is hereby corrected as shown below:

```
Column 6, line 24, change "step (d) to --step (d)(i)--.
Column 6, line 16, change "overlaying" to --overlying--.
Column 6, line 21, change "using he" to --using the--.
Column 6, lines 32-33, change "sour -ce/drain regions" to
   --source/drain regions--.
Column 6, line 46, change "metal gate nd" to --metal gate and--.
Column 7, line 11, change "step Z(d)" to --step (d)--.
Column 7, line 14, change "the step of" to -- the steps of--.
Column 7, line 21, change " provide in a" to -- providing a--.
Column 7, line 29, change "500° 0 C." to --500° C.--.
Column 7, line 37, change "elf-aligned" to --self-aligned--.
Column 7, line 46, change "tow" to --two--.
Column 7, line 56, change "portion o the" to --portion of the--.
Column 7, line 58, change "actuating the" to --activating the--.
Column 7, line 60, change "550° c." to --550° C.--.
Column 8, line 10, change "and rain" to --and drain--.
Column 8, line 14, change " and he" to -- and the--.
Column 8, line 23, change "550° c. or" to --550° C. for--.
Column 8, lines 35-36, change "transistor" to --transistors--.
Column 8, line 40, change "of he" to --of the--.
Column 8, line 48, change "labyrinth" to --layer in the--.
Column 8, line 55, change "an eh" to --and the--.
Column 8, line 64, change "L2therebetween nd to" to --L2
   therebetween and to--.
Column 9, line 6, change "(i)" to --(k)--.
Column 9, line 13, change "each o the" to --each of the--.
Column 9, line 17, change "claim 12" to --claim 18--.
Column 9, line 20, change "M_2" to --M2--.
Column 9, line 23, change "P-tyep" to --P-type--.
Column 8, line 54, change "dopant using" to --dopant ions using--.
```

UNITED STATES PATENT AND TRADEMARK OFFICE
CERTIFICATE OF CORRECTION

PATENT NO. : 5,169,796

DATED : December 8, 1992

INVENTOR(S) : Roger Murray and Nevand Godhwani

It is certified that error appears in the above-identified patent and that said Letters Patent is hereby corrected as shown below:

```
Column 10, line 12, change "P-tyep" to --P-type--.
Column 10, line 13, change "he first" to --the first--.
Column 10, lines 17-18, change "transistor" to --transistors--.
Column 10, line 20, change "P-tyep" to --P-type--.
Column 10, line 21, change "he first" to --the first--.
Column 10, line 22, change "he first" to --the first--.
Column 10, line 25, change "ridge" to -- bridge--.
```

Signed and Sealed this

Eighteenth Day of January, 1994

Attest:

BRUCE LEHMAN

Attesting Officer     Commissioner of Patents and Trademarks